United States Patent [19]

Endroes et al.

[11] Patent Number: 5,579,388
[45] Date of Patent: Nov. 26, 1996

[54] NETWORK-INDEPENDENT ELECTRICAL ENERGY USER WITH ADDITIONAL, PHOTOVOLTAIC POWER SUPPLY

[75] Inventors: Arthur Endroes, Munich; Richard Einzinger, Steinhoering, both of Germany

[73] Assignee: Siemens Aktiengesellschaft, Munich, Germany

[21] Appl. No.: 432,053

[22] Filed: May 1, 1995

[30]   Foreign Application Priority Data

Apr. 29, 1994 [DE] Germany ............... 44 15 131.4

[51] Int. Cl.⁶ ............... H04M 19/00; H01L 31/0368
[52] U.S. Cl. ............... 379/433; 136/258; 136/261
[58] Field of Search ............... 136/251, 261, 136/258 PC, 291; 379/433

[56]   References Cited

U.S. PATENT DOCUMENTS

| | | | |
|---|---|---|---|
| 4,697,360 | 10/1987 | Sartor | 36/2.6 |
| 4,717,790 | 1/1988 | Gochermann | 136/251 |
| 4,827,534 | 5/1989 | Haugen | 2/108 |
| 4,835,918 | 6/1989 | Dippel | 52/63 |
| 4,882,239 | 11/1989 | Grimmer et al. | 429/7 |
| 5,051,254 | 10/1991 | Yaba et al. | 136/251 |
| 5,210,804 | 5/1993 | Schmid | 381/69.2 |

FOREIGN PATENT DOCUMENTS

| | | | |
|---|---|---|---|
| 9011989 U | 12/1990 | Germany . | |
| 3-45986 | 2/1991 | Japan | 136/291 X |

OTHER PUBLICATIONS

"Crystalline Silicon For Solar Cells," Martinelli, *Solid State Phenomena*, vol. 32–33 (1993) pp. 21–26.
"Growth of Stable Dislocation–Free 3–Grain Silicon Ingots for Thinner Slicing," Martinelli et al., *Appl. Phys. Lett.* 62(25), Jun. 21, 1993, pp. 3262–3263.

*Primary Examiner*—Aaron Weisstuch
*Attorney, Agent, or Firm*—Hill, Steadman & Simpson

[57]   ABSTRACT

For additional energy supply and for recharging the energy store of a network-independent, portable electrical energy user, at least one flexible solar cell which is fabricated of a thin silicon tri-crystal wafer is laminated on the surface of the energy user.

8 Claims, 2 Drawing Sheets

NETWORK-INDEPENDENT ELECTRICAL ENERGY USER WITH ADDITIONAL, PHOTOVOLTAIC POWER SUPPLY

BACKGROUND OF THE INVENTION

1. Field of the Invention

The present invention is directed to portable, network-independent electrical energy users, more particularly, however, to electrical handsets that are carried in the hand for use or during use.

2. Description of the Prior Art

Energy users or electrical handsets have an energy supply that is buffered by an energy store, which is usually rechargeable. Preferably rechargeable energy stores such as capacitors or accumulators, for example known nickel cadmium cells, are suitable in addition to non-rechargeable batteries such as alkali cells, zinc carbon batteries, or mercury button cells.

The maximum possible operating time of a network-independent energy user is dependent on the electrical power that the energy user uses in its operating conditions as well as on the capacity of the energy store that is built into the energy user. Since the usability and the competitiveness of the energy user also increase with an increasing operating time, there is a general desire to lengthen this by reducing the power consumed or by increasing the storage capacity of the energy store.

A further possibility for extending the network-independent operating time of a mobile energy user is to provide an additional photovoltaic energy supply. Given adequate light incidence, the photovoltaically generated energy can relieve, replace, and/or recharge the energy store.

Heretofore, high-performance solar cells having an efficiency above 15 percent have only been manufactured of crystalline semiconductor materials such as silicon (c-Si) or gallium arsenide. These materials, however, have the disadvantage that only planar or at most slightly curved solar cells can be manufactured therefrom, because such known solar cells are not capable, or are only insufficiently capable, of being bent due to the fragility of the crystalline semiconductors and the lack of flexibility deriving therefrom.

The employment of high-performance solar cells in mobile energy users has thus hitherto been dependent on making an adequately flat and free surface available at the user that can be equipped with planar, crystalline solar cells. In smaller mobile electrical users, and in particular in electrical handsets, however, the surface on which solar cells can usually be applied is limited. Without enormous added outlay, moreover, it is not possible to provide recesses in the solar cell in order to create space for raised or sunken parts or to create access to functional parts such as keys or switches. The occupation of the flat and free surface of the electrical energy user that is available is therefore usually only possible with solar cells that are fashioned approximately rectangular or round.

A further problem is that, due to the fragile nature of the crystalline solar cells, an increased thickness of the material for the support and/or covering of the solar cell is required, which causes additional weight for the portable energy user.

SUMMARY OF THE INVENTION

It is an object of the present invention to provide a portable electrical energy user that has an improved energy supply and avoids the aforementioned disadvantages.

The above object is achieved in accordance with the principles of the present invention in a network-independent, portable electrical energy user having an energy supply buffered by an energy store, and having at least one flexible solar cell laminated on an exterior surface of the energy user for additional energy supply and for re-charging the energy store, the solar cell being fabricated of a thin silicon tri-crystal wafer.

For additional energy supply of the energy user, at least one solar cell that is fabricated of a thin silicon tri-crystal is inventively laminated on the surface of the energy user. Such a tri-crystal is known from an article by G. Martinelli in *Solid State Phenomena*, Vol. 32–33 (1993), pages 21–26. This is composed of three monocrystalline regions tilted relative to one another. The phase boundaries between any two of the monocrystalline regions are formed by planes, whereby three such planes exist, which intersect along a straight line that is shared by all three planes. The boundary surfaces between any two of the monocrystalline regions are preferably formed by crystallographically defined planes of the silicon crystal and represent <111>-planes. Consequently, the planes defined by these boundary surfaces also intersect at crystallographically determined angles that twice assume the value of 125.26° and once the value of 109.47° in the ideal case, viewed vertically relative to the common line of intersection.

Such a tri-crystal has the advantage that it contains no <111>-plane that proceeds completely through the crystal. A conventional silicon monocrystal preferably has offsets along such <111>-planes that arise during crystal drawing and represent privileged likely break points. An offset plane that cuts through the entire crystal, however, does not exist in the tri-crystal, so that breakage along such a plane is impossible. Breaking apart along the boundary surfaces is made more difficult since these are angled in the common point of intersection or in the common axis of intersection.

Wafers that are extremely resistant to breakage can be sawn from such a tricrystal. This results in even wafers having a thickness of only 60 μm can be sawn from the tri-crystal with a high yield of, for example, 95%, these wafers in turn being not only extremely resistant to breakage but also unusually flexible. A thin tri-crystal wafer can be unproblematically bent by suitable methods (laminating), whereby radii of curvature down to about 1 cm can be achieved without breaking the tri-crystal wafer.

Since a solar cell manufactured therefrom also has the same advantageous mechanical properties as the tri-crystal wafer, it can also be applied in a simple way on one-dimensionally curved exterior surfaces of the energy user, or the housing thereof.

With a thickness of, for example, 60 through 100 μm, the solar cell is substantially thinner than conventional c-Si solar cells that must have a thickness of, for example, 300 μm for mechanical reasons. This reduces the weight of the solar cell and, thus, the weight of the energy user, the manipulation thereof thereby being facilitated.

Given the same thickness, moreover, a solar cell laminated onto a curved surface is also significantly stiffer and thus more mechanically stable, than a solar cell laminated on a planar substrate. As a result, the required mechanical stability is already present with a thinner overall layer thickness (for the laminate of surface material or housing material, solar cell, and covering) than given a comparable planar embodiment.

A further advantage of the new energy supply for the inventive energy user is the improved efficiency that can be achieved with a thinner solar cell. Given material quality that is otherwise the same, a thinner solar cell achieves a higher no-load voltage given an otherwise unaltered short circuit current and fill factor. Moreover, a thin solar cell with a lower diffusion length of the minority charge carriers, i.e. with a lower electronic quality of the silicon, can also achieve the same efficiency as a correspondingly thicker solar cell composed of a material having a higher diffusion length.

Given the same exterior area, an energy user inventively provided at its exterior with solar cells has a noticeably enhanced, network-independent on-time than having conventional solar cells having the same material quality. Compared to an energy user with conventional solar cells, the inventive energy user is also lighter in weight, mechanically more stable and can have a more attractive design since the flexible solar cells can also be laminated onto one-dimensionally curved surfaces.

The required solar cells can be made available at a substantially lower price since the saving of material alone amounts to approximately 75% compared to conventional solar cells of monocrystalline silicon. A further cost-cutting relating to the solar cell is that cooling of the drawn tri-crystal requires less time, and the drawing process can ensue more frequently from the same crucible than when drawing a monocrystal rod, due to the lack of a dislocation risk of the crystal lattice.

An energy user that has operating elements such as switches or keys, display elements or other projections or depressions on an exterior surface can also have solar cells laminated onto this surface in one embodiment of the invention. The solar cell that is laminated on has clearances (recesses or openings) at the locations provided for the control elements or for the display. The clearances can be arranged at the edge of the solar cell that has been laminated on as well as being inwardly disposed. It is thus not only possible to manufacture solar cells having an arbitrarily shaped base area but also it is possible to provide round or angled holes or differently shaped clearances in the interior of the solar cell. Such "customizing" is not possible given conventional monocrystalline solar cells because of their higher risk of breakage.

Due to the possibility of providing corresponding clearances in the solar cell or cells, the exterior area of the energy user that can be covered with solar cells is enlarged, whereby the power made additionally available by the solar cells is also increased. The network-independent on-time is thus also lengthened.

In a preferred embodiment of the invention, the inventive energy user is a mobile telephone or a cordless telephone. Cordless telephones require powers of less than 100 mW in standby mode and approximately 250 Mw in transmission mode. Mobile radiotelephones according to the GSM standard that can be operated in the German D-network require typical powers of 175 Mw in standby mode and about 2 Watts in transmission mode.

Using only the batteries or accumulators that are currently available, this allows typical call durations of 1 to 2 hours, after which the accumulators must be recharged. As a result, a completely mobile, i.e. completely network-independent operation of these telephones is only possible to a very limited extent.

Given adequate solar irradiation, the typical call duration for an inventively fashioned mobile telephone is lengthened by a factor of about 2. Assuming an average collecting efficiency of 18 through 20% for the solar cell and an area of 100 $cm^2$ covered with solar cells, a peak power of 2 Watts given an AM 1.5 illumination is obtained, which would even enable a network-independent continuous call mode for the inventive mobile telephone. Since only a significantly smaller surface is available for covering with conventional solar cells, this result is not achieved with conventional solar cells.

In a further embodiment of the invention, the energy user, and in particular the portable telephone has at least one part that can be opened out by means of a hinged connection to the housing and that is covered with solar cells. This enlarges the solar cell area that is available and that can be directed toward the sun. The hinged part can thereby fulfill an additional function and, for example, can simultaneously form a cover for the operating elements of the energy user (telephone). It is also possible to cover two principal faces of the energy user or telephone that lie opposite one another with solar cells and to implement one of these principal faces, especially the back side, as a hinged cover. It is thus possible to open the cover when the user is in the idle condition, to enlarge the solar cell area that can be directed toward the sun and to enable a faster charging of the energy store. Upon operation of the energy user, i.e., for example, when telephoning, the cover is closed, so that the user or telephone regains its original, compact form, that assures good handling.

DESCRIPTION OF THE PREFERRED EMBODIMENTS

Figure 1:
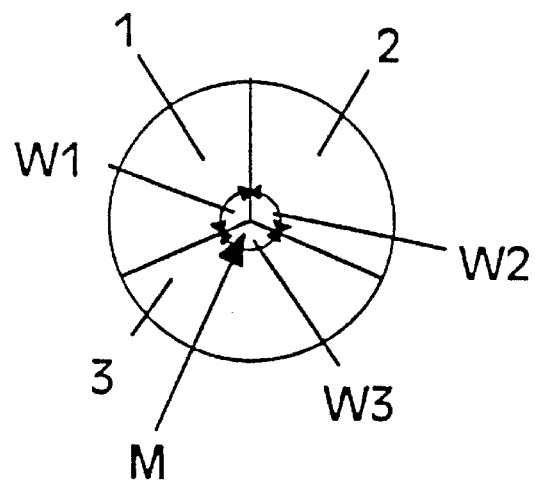
FIG. 1 shows a tri-crystal wafer, suitable for use in an energy user constructed in accordance with the principles of the present invention.

Identical parts or parts that correspond to one another are provided with the same reference characters.

FIG. 1 shows a tri-crystal wafer of a type that can be employed for the manufacture of solar cells for the inventive energy user. Three monocrystalline regions 1, 2, and 3 are separated by phase boundaries that proceed on a straight line. These meet in the middle M of the wafer and describe the angles W1, W2, and W3 with one another. Insofar as the phase boundaries between any two of the monocrystalline regions correspond exactly to crystallographic <111>-planes and the wafer was sawn exactly vertically relative to the middle axis, or relative to the common section line of the three planes containing the phase boundaries, the angle W3 amounts to exactly 109.47°. Given uniform growth, the other two angles are then also of exactly the same size and amount to 125.26°. Under these growing and sawing conditions, all three monocrystalline regions 1, 2, and 3 in the tri-crystal wafer have a <110>-surface. It is also possible to saw the wafers with saw cuts that are not oriented vertically relative to the middle axis, in which case the angles W1 through W3 can correspondingly change. The limiting surfaces can also deviate from the ideal <111>-planes by ±2%.

A solar cell can be manufactured with a thickness of 60 through 100 μm from the tri-crystal wafer with conventional method steps. To that end, a pn-junction is produced in a lightly p-doped silicon crystal wafer by drive-in of phosphorous to, for example, a depth of 1 μm.

The front contact and the back contact of the solar cell can be applied, for example, by silkscreening.

For reducing the surface recombination of charge carrier pairs, a passivation layer is applied after the manufacture of the contacts, for example by growing an oxide.

Before the implementation of these steps, the surface of the tri-crystal wafer that serves as a light incidence side can be provided with a roughened surface structure by structural etching, for example with an apertured mask. This improves the light incidence geometry by avoiding reflection losses.

As a further performance-enhancing measure for the solar cells, a back surface field can be produced, for example by driving boron or aluminum into the back side of the wafer or solar cell. A shallow n++ doping that is applied only in the region of the front contacts further increases the efficiency.

These and other non-inventive method steps for the manufacture of a solar cell from a tri-crystal wafer may be derived from German Patent Application P 43 43 296.4. The only thing that is decisive for the invention is that the solar cell is manufactured of a thin tri-crystal wafer that is flexible enough in order to be laminated onto a one-dimensionally curved surface of a user.

Figure 2:
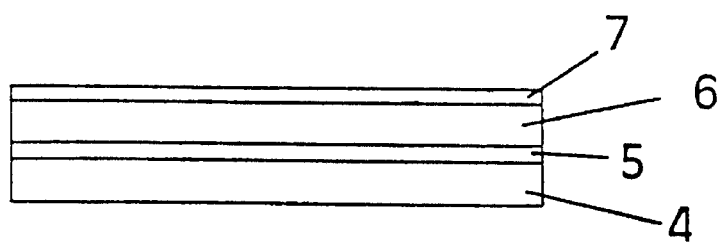
FIG. 2 shows a laminated solar cell constructed in accordance with the principles of the present invention, in a schematic cross-section.

In a schematic cross-section, FIG. 2 shows a solar cell laminated onto a surface. The surface 4 is the exterior surface of the energy user, fabricated, for example, of plastic or of a metal such as aluminum. For laminating, an adhesive foil 5, for example a hot-melt adhesive foil of thermoplastic plastic, is arranged between the solar cell 6 and the surface 4. A further plastic foil 7, which can likewise be a hot-melt adhesive foil or a protective foil composed of resistant, transparent plastic material, for example perfluoridated polyethylene, laminated on with a hot-melt adhesive foil, can serve for covering and sealing the solar cell 6.

For lamination, the layers are laid over one another in the sequence shown in FIG. 2 and are heated, under pressure, above the softening point of the hot-melt adhesive foil. The lamination process can be conducted in a vacuum.

Figure 3:
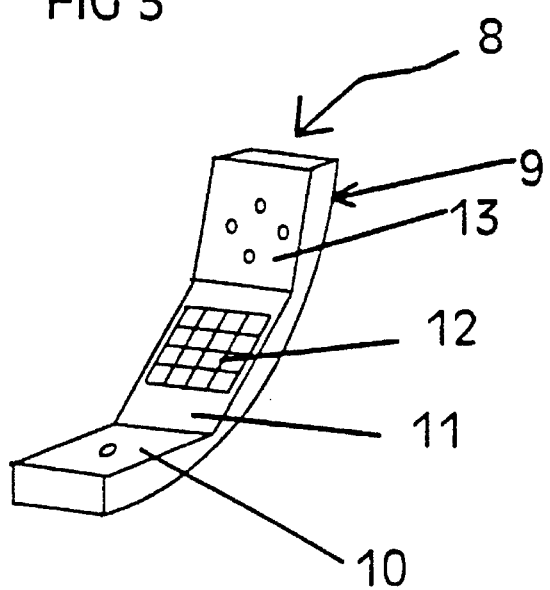
FIGS. 3 through 6 respectively show energy users in the form of telephones constructed in accordance with the principles of the present invention of the present invention from various perspectives.

The surface 4 onto which the solar cells 6 are laminated can be one-dimensionally curved, as shown in the embodiment of FIG. 3, because the laminate is sufficiently stable to be subjected to a further shaping process, for example a stamping or cutting process, in order to bring the laminate into a desired shape or, if required, to cut out or stamp out recesses.

An exemplary embodiment for a mobile energy user in the form of a radio telephone 8 is shown in FIG. 3, having flexible solar cells laminated thereon. In accordance with the invention, one or more of the surface regions of the radio telephone 8 can have solar cells laminated thereon. The curved back side 9 of the radio telephone 8 offers the largest continuous surface, however, it is also possible to provide the front side of the radio telephone 8, shown in three regions, with laminated solar cells, in a microphone region 10, an operating region 11, and a speaker region 13. By cutting or stamping out recesses, openings are provided which remain free for the microphone, the speaker and the key field 12.

Figure 4:
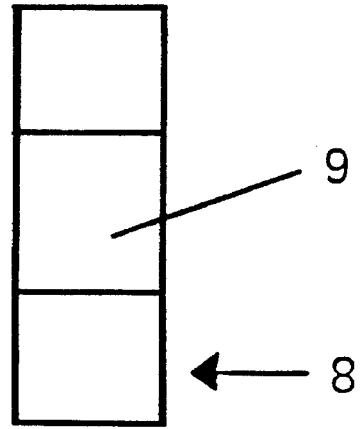

FIG. 4 shows the back side 9 of the radio telephone 8, which can be one-dimensionally curved, as shown in FIG. 3. The back side 9 of the radio telephone 8 is completely covered with one or more solar cells, and a solar cell can also be laminated on the rounded-over edges, which have respective radii of curvature as low as 1 cm.

Figure 5:
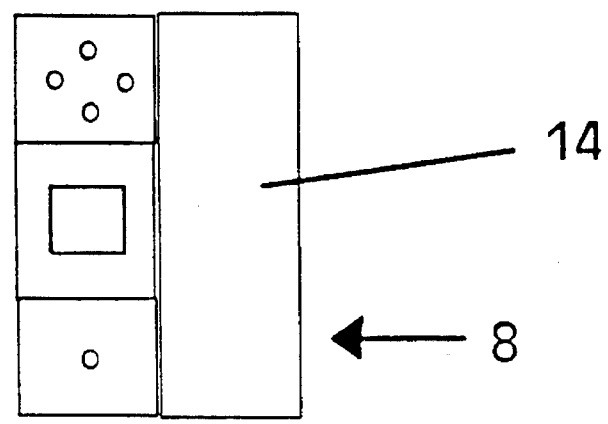

As a further exemplary embodiment of an inventive energy user, FIG. 5 shows a plan view of a differently fashioned radiotelephone. This telephone has a cover 14 that can be hinged laterally out and that has its back side (not shown in the drawing) covered with flexible solar cells that have been laminated on. The cover 14 can be a cover for the front side of the radiotelephone and, thus, a protection for the functional pans such as the key field, microphone, and loudspeaker part. It is also possible, however, to provide a laterally hingeable cover 14 at the back side.

Figure 6:
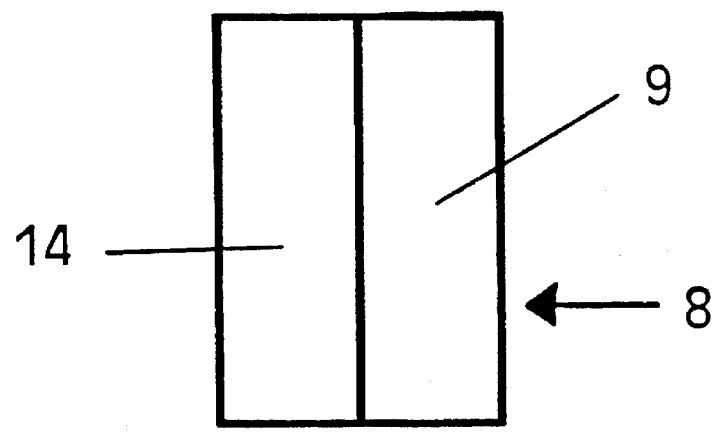

FIG. 6 shows the telephone of FIG. 5 from the back. The back side 9 as well as the visible side of the opened cover 14 are covered surface-wide with flexible solar cells.

The cover 14 is preferably a cover for the back side 9 of the telephone. It is thereby possible to open the cover on its hinge only in the idle condition or in standby mode and when adequate solar irradiation is present. In case of a call, the cover 14 is hinged back onto the back side, whereby a compact handset as shown in FIG. 3 is again obtained. In the hinged-down condition, the cover 14 covers the solar cells on the back side 9 of the telephone, so that the surfaces shown in FIG. 6 are no longer visible in the (folded) operating condition of the telephone. Of course, it is also possible to likewise cover the sides of the telephone, which are not shown in FIG. 6, or to cover the cover 14, with solar cells.

It is clear that the inventive energy user is not limited to the radiotelephone shown in the exemplary embodiments. On the contrary, all electrically operated, network-independent handsets can be inventively fashioned. The invention always offers particular advantages when a high energy consumption requires frequent replacement or recharging of the energy store, when lower weight is desired for simpler handling of the handset or energy user, or when longer pauses in operation or longer phases with standby mode that uses little energy occur.

Although modifications and changes may be suggested by those skilled in the art, it is the intention of the inventors to embody within the patent warranted hereon all changes and modifications as reasonably and properly come within the scope of their contribution to the art.

We claim as our invention:

1. A network-independent, portable electrical energy user comprising:

a housing containing energy-consuming electrical components;

an energy supply buffered by an energy store in said housing; and a flexible solar cell laminated on an exterior surface of said housing and electrically connected to said energy store for supplying additional energy thereto and for re-charging said energy store, said solar cell comprising a thin silicon tri-crystal wafer.

2. An energy user as claimed in claim 1 wherein said solar cell comprises an active semiconductor layer consisting of said silicon tri-crystal wafer and having a thickness in a range from 60 to 100 μm.

3. An energy user as claimed in claim 1 wherein said housing has an exterior surface which is one-dimensionally curved, and wherein said solar cell is laminated on said one-dimensionally curved surface.

4. An energy user as claimed in claim 1 wherein said energy user comprises a mobile radio telephone.

5. An energy user as claimed in claim 1 wherein said energy user comprises a telephone.

6. An energy user as claimed in claim 1 further comprising a plurality of operating elements disposed at said exterior of said housing, and wherein said solar cell comprises a clearance for said operating elements.

7. An energy user as claimed in claim 1 wherein said solar cell comprises three monocrystalline regions tilted relative to each other and limited on a surface of said solar cell by straight lines intersecting at a point.

8. An energy user as claimed in claim 7 wherein said lines intersect at a point describing two angles of 125.26° and one angle of 109.47°, both angles being ±2°, and wherein all boundary surfaces between any two of said monocrystalline regions comprise crystallographic <111>-planes of silicon.

* * * * *